United States Patent
Chen et al.

(10) Patent No.: US 12,000,756 B2
(45) Date of Patent: Jun. 4, 2024

(54) LEAKAGE DETECTION SYSTEM

(71) Applicant: AURAS TECHNOLOGY CO., LTD., New Taipei (TW)

(72) Inventors: Chien-Yu Chen, New Taipei (TW); Tian-Li Ye, New Taipei (TW); Jen-Hao Lin, New Taipei (TW); Wei-Shen Lee, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 757 days.

(21) Appl. No.: 17/118,855

(22) Filed: Dec. 11, 2020

(65) Prior Publication Data

US 2021/0389205 A1    Dec. 16, 2021

Related U.S. Application Data

(60) Provisional application No. 63/038,191, filed on Jun. 12, 2020.

(30) Foreign Application Priority Data

Oct. 21, 2020   (TW) ................................ 109136471

(51) Int. Cl.
*G01M 3/16*     (2006.01)
*G06F 1/20*     (2006.01)
*H05K 7/20*     (2006.01)

(52) U.S. Cl.
CPC ............... *G01M 3/16* (2013.01); *G06F 1/20* (2013.01); *H05K 7/20272* (2013.01); *H05K 7/20763* (2013.01); *G06F 2200/201* (2013.01)

(58) Field of Classification Search
CPC ...... G01M 3/16; G06F 1/20; G06F 2200/201; H05K 7/20272; H05K 7/20763
See application file for complete search history.

(56) References Cited

U.S. PATENT DOCUMENTS

2019/0265124 A1* 8/2019 Yu ......................... H01B 13/00

FOREIGN PATENT DOCUMENTS

KR         20150127951 A   * 11/2015

OTHER PUBLICATIONS

KR 20150127951 A Machine Translation, Dec. 30, 2023.*

* cited by examiner

*Primary Examiner* — Sisay Yacob
(74) *Attorney, Agent, or Firm* — Amin, Turocy & Watson, LLP

(57) ABSTRACT

A leakage detection system is provided and includes a substrate provided between a first element and a second element, and at least one sensing unit provided on the substrate to generate an electrical signal when coming into contact with a leakage liquid. As such, warnings can be provided when coming into contact with the leakage liquid to avoid significant loss of assets.

8 Claims, 4 Drawing Sheets

LEAKAGE DETECTION SYSTEM

BACKGROUND

1. Technical Field

The present disclosure generally relates to a leakage detection system. More specifically, the present disclosure relates to a leakage detection system in the field of heat dissipation.

2. Description of Related Art

In the face of modernization, computers and various other electronic devices have seen rapid developments with continuously improved performance. However, along with these improvements, heat dissipation has become one of the major issues faced by high performance hardware today. Typically, computers and electronic devices employ heat dissipation components to help dissipate heat away. For example, a thermal paste or cooling fins can be attached to an electronic component that is subjected to heat dissipation in order to absorb heat and disperse it. However, this type of heat dissipation has only a limited heat dissipation effect. Modules that dissipate heat through liquid cooling have thus been developed.

Existing heat dissipation modules by liquid cooling typically use cooling liquids to absorb heat energy. For example, after allowing a cooling liquid to flow through an electronic component subject to heat dissipation, the heated cooling liquid can then flow to a place with a lower temperature in order for heat exchange to take place. After heat is exchanged, the cooling liquid can return to the electronic component to absorb more heat energy, thereby creating a circulation of heat dissipation.

However, during transportation of the computers and various other electronic devices, pipes for conveying cooling liquids in the existing heat dissipation modules may become undone or break due to shaking, causing the cooling liquids to leak out. If the leaking liquids drop on components inside the computers and various other electronic devices, short circuit may occur.

Therefore, there is a need to provide a leakage detection system that effectively addresses the aforementioned shortcomings of the prior art.

SUMMARY

The present disclosure is to provide a leakage detection system, which may include: a substrate provided between a first element and a second element; and at least one sensing unit provided on the substrate for generating an electrical signal when coming into contact with a leakage liquid.

In the leakage detection system above, the present disclosure further comprises an absorbent layer provided between the first element and the second element for absorbing the leakage liquid of the first element or the second element and guiding the leakage liquid to the sensing unit.

In the leakage detection system above, the present disclosure further comprises at least one connector connecting the first element and the second element and surrounded by the substrate, the sensing unit and the absorbent layer.

In the leakage detection system above, the substrate and the sensing unit are positioned between the at least one connector and the absorbent layer.

In the leakage detection system above, the present disclosure further comprises an isolation layer provided on an outer side of the absorbent layer for preventing external liquids from penetrating into the absorbent layer.

In the leakage detection system above, the absorbent layer is positioned between the substrate and the at least one connector.

In the leakage detection system above, the present disclosure further comprises an isolation layer provided on outer sides of the substrate and the sensing unit for preventing external liquids from penetrating into the substrate and the sensing unit.

In the leakage detection system above, the present disclosure further comprises a barrier layer provided on an outer side of where the isolation layer joins with the first element for preventing the leakage liquid.

In the leakage detection system above, the first element is a pipe, the second element is a liquid cooling device, and the connector connects the pipe and the liquid cooling device.

In the leakage detection system above, the first element engages with the second element, such that the first element and the second element cooperatively define a liquid cooling device having a chamber.

In the leakage detection system above, the substrate, the sensing unit and the absorbent layer are provided on the second element around a periphery of a heat transfer structure in the liquid cooling device.

The leakage detection system above may further include: a processing module coupled to the substrate and the sensing unit via a signal line for generating a warning signal upon receiving the electrical signal, the warning signal being transmitted to a buzzer on a circuit board via another signal line coupled between the processing module and the circuit board or transmitted to a software interface.

In the leakage detection system above, the sensing unit is a capacitive or a resistive humidity sensor.

BRIEF DESCRIPTION OF THE DRAWINGS

FIG. 2' is a schematic view of another embodiment of a leakage detection system in accordance with the present disclosure.

DETAILED DESCRIPTION

Embodiments of the present disclosure are illustrated with specific implementations. Other advantages and technical effects of the present disclosure can be readily understood by one with ordinary skill in the art upon reading the disclosure provided herein, and can be used or applied in other different implementations.

Figure 1:
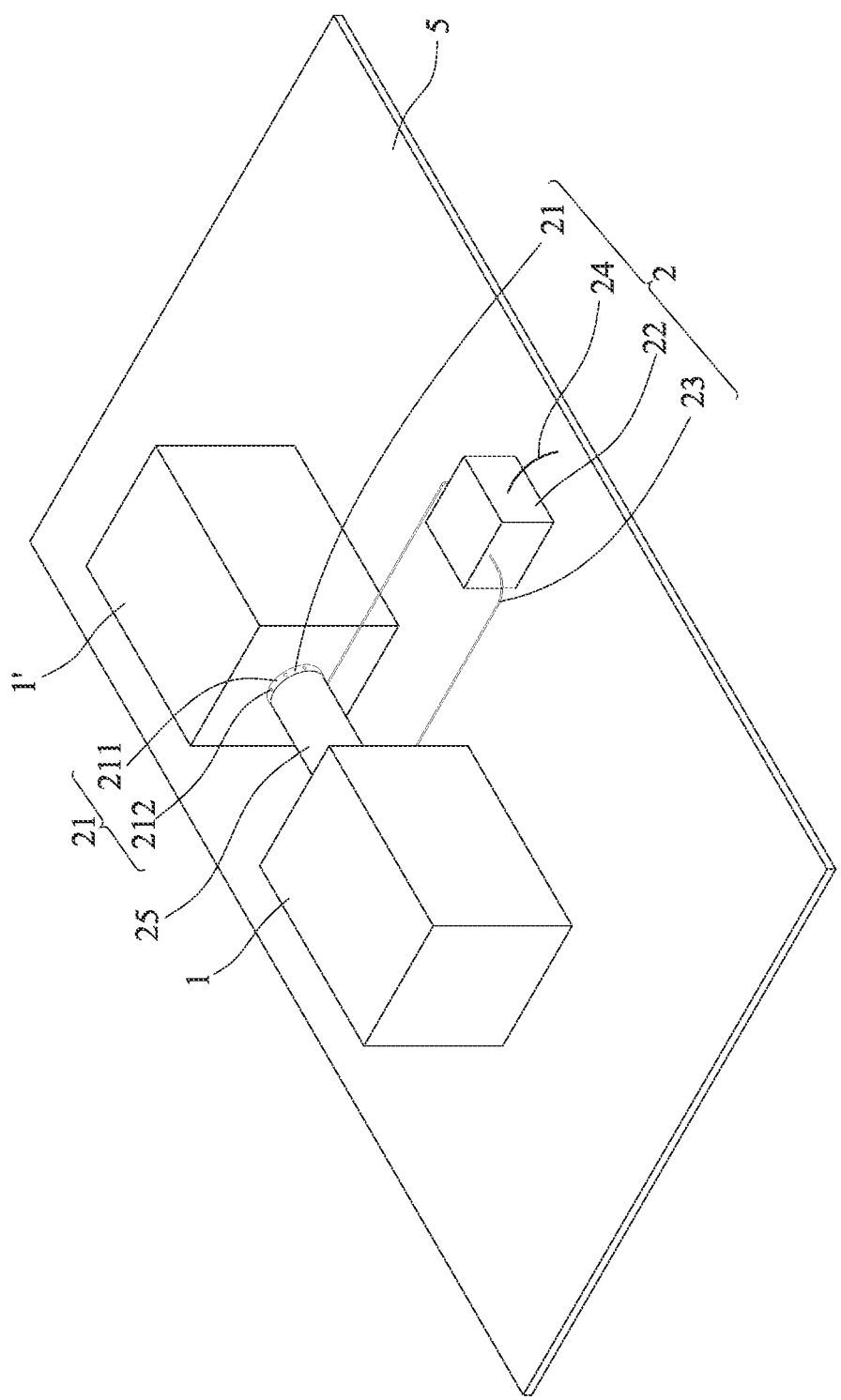
FIG. 1 is a schematic view of a leakage detection system in accordance with the present disclosure.
Figure 2:
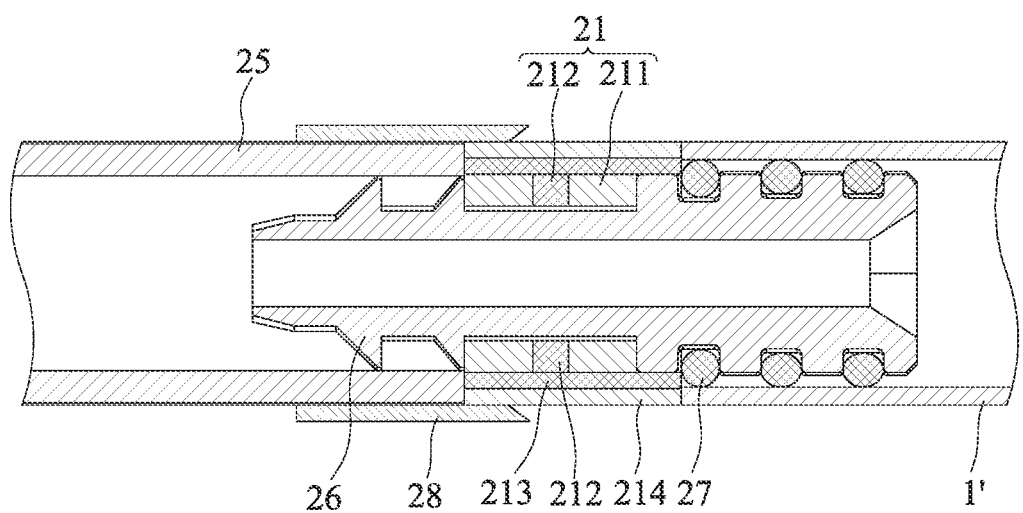
FIG. 2 is a partial cross-sectional view of the leakage detection system in accordance with the present disclosure.
Figure 2:
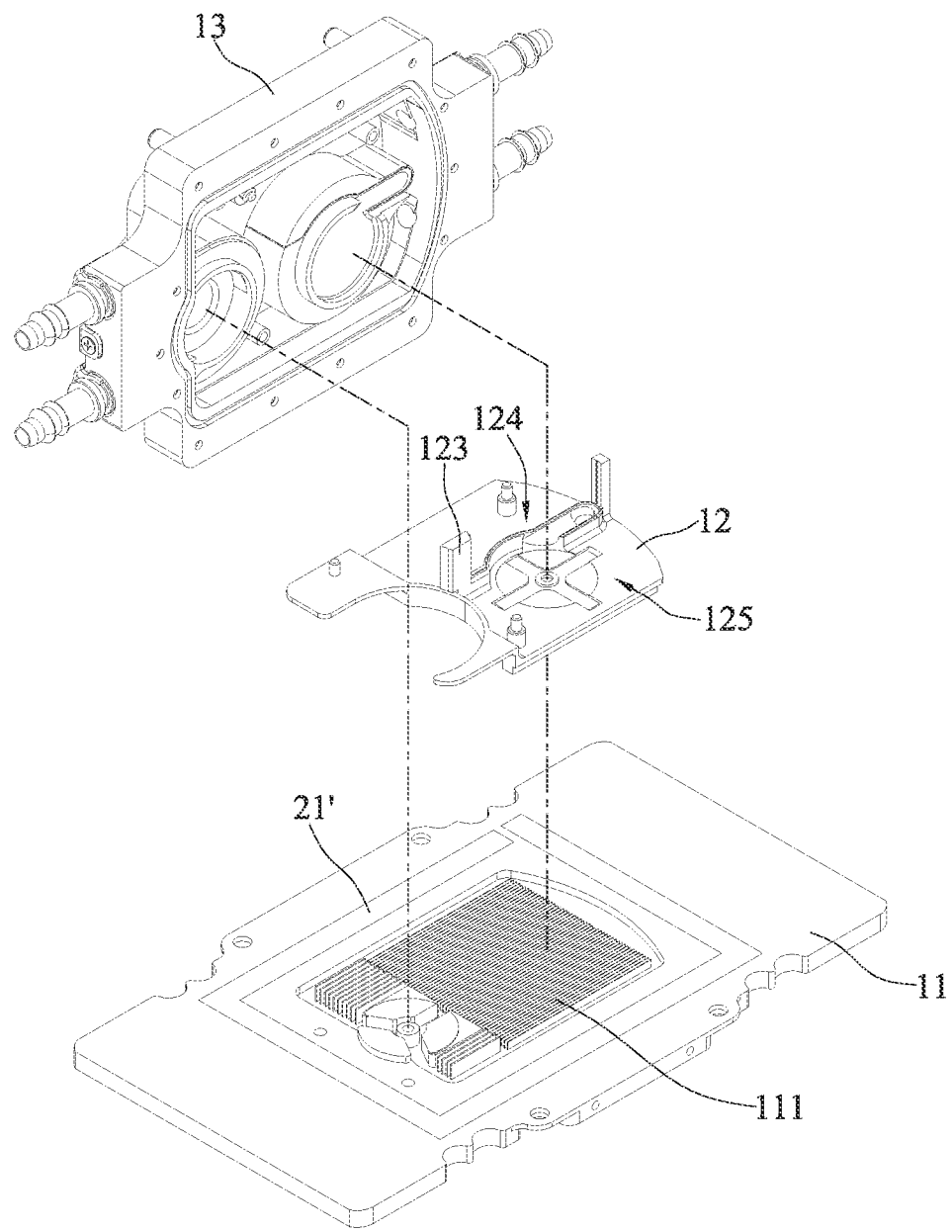

Referring to FIG. 1 in conjunction with FIG. 2, a leakage detection system 2 in accordance with the present disclosure can be installed on a liquid cooling device 1, 1' (e.g., a pump, a water cooling radiator, a water cooling block, etc.). The leakage detection system 2 includes a leakage detection structure 21, a processing module 22, and signal lines 23, 24. The processing module 22 can be coupled to the leakage detection structure 21 via the signal line 23, and coupled to a circuit board 5 via the signal line 24. In addition, the leakage detection structure 21 further includes a substrate 211 and at least one sensing unit 212. The sensing unit 212 is provided on the substrate 211 (or the sensing unit 212 is embedded in the substrate 211 and exposed from two surfaces of the substrate 211) for generating an electrical signal when coming into contact with a leakage liquid.

In an embodiment, the substrate 211 is provided between a first element and a second element, wherein the first element can be a pipe 25, and the second element can be the liquid cooling device 1, 1'.

In an embodiment, the sensing unit 212 can be a capacitive or resistive humidity sensor. For example, the humidity sensor generates an electrical signal when a certain degree of humidity is detected. However, the present disclosure is not limited as such.

In an embodiment, the substrate 211 can be a flexible thin film or a soft circuit board, so that the substrate 211 can be provided around at least one connector 26 (e.g., a quick connector, an adapter, etc.) of the pipe 25 and the liquid cooling device 1. The connector 26 is used for connecting with the pipe 25. In another embodiment, there can be one or a plurality of sensing unit(s) 212. If there are a plurality of sensing units 212, the sensing units 212 can be arranged on the substrate 211 at equal intervals, such that the connector 26 of the liquid cooling device 1 can also be surrounded by the plurality of sensing units 212. In still another embodiment, the plurality of sensing units 212 can be configured to detect leakage liquid from different objects. In this case, when the processing module 22 receives electrical signals fed back from different sensing units 212 via the signal line 23, the processing module 22 can determine from which object the leakage liquid originated based on different electrical signals. For example, when there are two sensing units 212, one can be arranged on the side of the substrate 211 in proximity to the liquid cooling device 1, while the other one can be arranged on the side of the substrate 211 in proximity to the pipe 25. The sensing unit 212 closer to the liquid cooling device 1 can be used for detecting leakage liquid originating from the liquid cooling device 1, whereas the sensing unit 212 closer to the pipe 25 can be used for detecting leakage liquid originating from the pipe 25. The processing module 22 can determine whether a leakage liquid is coming from the liquid cooling device 1 or the pipe 25 based on the electrical signals fed back from the different sensing units 212.

In an embodiment, as shown in FIG. 2, the substrate 211 and the sensing unit 212 can be provided on an exposed portion of the connector 26 after the liquid cooling device 1' is connected with the pipe 25. In addition, an absorbent layer 213 (e.g., an absorbent sponge) can be further provided between the first element and the second element (e.g., on the outer sides of the substrate 211 and the sensing units 212). The absorbent layer 213 not only covers the substrate 211 and the sensing unit 212, but also covers the portions of the connector 26 not covered by the substrate 211 and the sensing unit 212. The absorbent layer 213 seals the junction between the connector 26 and the liquid cooling device 1'. As such, the substrate 211 and the sensing unit 212 are disposed between the connector 26 and the absorbent layer 213. In this way, if a liquid from the second element (e.g., a cooling liquid inside the liquid cooling device 1') leaks out due to an O-ring 27 between the connector 26 and the liquid cooling device 1' becoming undone or broken, the absorbent layer 213 is capable of absorbing leakage liquid of the O-ring 27 between the connector 26 and the liquid cooling device 1'. If a liquid from the first element (e.g., a cooling liquid inside the pipe 25) leaks out due to looseness or damage between the pipe 25 and the connector 26, the absorbent layer 213 is capable of absorbing leakage liquid between the connector 26 and the pipe 25. In addition, since the absorbent layer 213 exhibits capillary action, the absorbent layer 213 can absorb and retain the leakage liquid when coming into contact with the leakage liquid while guiding the leakage liquid absorbed and retained inside the absorbent layer 213 to the sensing unit 212.

In yet another embodiment, the absorbent layer 213 can seal the junction between the connector 26, the substrate 211 and the pipe 25, so as to absorb the leakage liquid at the junction and guide the leakage liquid to the sensing unit 212.

In an embodiment, an isolation layer 214 can be further provided on the outer side of the absorbent layer 213 to prevent external liquid from penetrating into the absorbent layer 213 and causing the sensing unit 212 to make false judgements. For example, during the transportation of the liquid cooling device 1, 1', dew may appear due to condensation as a result of temperature difference. The isolation layer 214 can effectively prevent dew from penetrating into the absorbent layer 213 and being guided to the sensing unit 212, which would otherwise cause the sensing unit 212 to make false judgements. In an embodiment, the thickness of the isolation layer 214 can be flush with the surfaces of the pipe 25 and the liquid cooling device 1', but the present disclosure is not limited as such.

In an embodiment, a barrier layer 28 can be provided on the outer side of where the isolation layer 214 and the pipe 25 join with each other (i.e., the junction). The barrier layer 28 can be used to further prevent leakage liquid and enhance sealing. In an embodiment, the barrier layer 28 can be made of polycarbonate, polyoxymethylene or nylon, but the present disclosure is not limited to these.

When the sensing unit 212 of the leakage detection structure 21 comes into contact with a leakage liquid, the sensing unit 212 generates an electrical signal (e.g., a short-circuit signal), which can be transmitted to the processing module 22 coupled with the substrate 211 and the sensing unit 212 via the signal line 23. After processing, the processing module 22 can send out a warning signal. More specifically, the warning signal can be transmitted to the circuit board 5 coupled with the processing module 22 via the signal line 24, for example, to a buzzer on the circuit board 5 and actuates the buzzer. In addition, the processing module 22 can also send the warning signal to a software interface. The software interface can visualize the layout status of the sensing units 212 and indicate which sensing unit 212 is in contact with the leakage liquid. Moreover, the software interface can determine the severity of the leakage (e.g., based on how many places are leaking, or even a humidity value), and changes the operations of the liquid cooling device 1, 1' accordingly to avoid significant loss of assets.

In an embodiment, the processing module 22 can be a hardware such as a processor or an integrated circuit (IC) chip, or a firmware, but the present disclosure is not limited as such.

Figure 3:
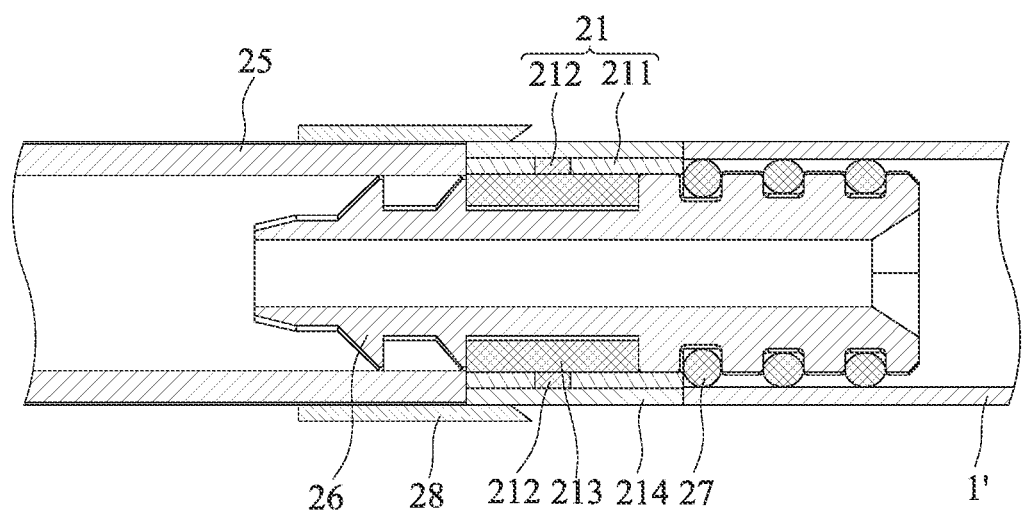
FIG. 3 is a partial cross-sectional view of the another embodiment of the leakage detection system in accordance with the present disclosure.

Referring to FIG. 3, a partial cross-sectional view of the another embodiment of the leakage detection system in accordance with the present disclosure is shown. This embodiment is different from the previous embodiment in the positions of the substrate 211, sensing unit 212 and the absorbent layer 213. Only the differences are described below, while the technical content that are the same or similar will not be repeated.

In an embodiment, the absorbent layer 213 is first provided on the exposed portion of the connector 26 after the liquid cooling device 1' is connected with the pipe 25. The absorbent layer 213 is used for absorbing leakage liquid from the connector 26. More specifically, the absorbent layer 213 can absorb leakage liquid generated from a broken connector 26, or leakage liquid from the junctions between the connector 26 and the pipe 25 or between the connector 26 and the liquid cooling device 1'. Then, the substrate 211 and the sensing unit 212 are provided on the absorbent layer 213, such that the absorbent layer 213 is positioned between the substrate 211 and the connector 26. The substrate 211 and the sensing unit 212 can cover the portion of the connector 26 not covered by the absorbent layer 213, and seals the junction between the connector 26 and the liquid cooling device 1'. As a result, the sensing unit 212 on the substrate 211 can generated an electrical signal based on a leakage liquid guided by the absorbent layer 213.

In an embodiment, an isolation layer 214 can be further provided on the outer sides of the substrate 211 and the sensing unit 212 to prevent external liquids from reaching into the substrate 211 and the sensing unit 212, for example, prevent dew created due to temperature differences during transportation.

In an embodiment, a barrier layer 28 can be further provided on the outer side of where the isolation layer 214 joins with the pipe 25 (i.e., the junction thereof) to further prevent leakage liquid and enhance sealing.

In other embodiments, referring to FIG. 2', in addition to providing the leakage detection structure 21' around the connector 26 of the liquid cooling device 1, 1', a leakage detection structure 21' of the present disclosure can also be provided in a chamber defined between the first element and the second element. In an embodiment, the first element can be a housing 13, and the second element can be a base 11, and the first element can engage with the second element, such that the first element and the second element can cooperatively define a liquid cooling device having chambers 124 and 125 (divided by a baffle 123). For example, the leakage detection structure 21' can be provided on the base 11 around the periphery of a heat transfer structure 111 (e.g., fins) in the liquid cooling device 1, 1'. In this way, the leakage detection structure 21' can be used to detect any leakage of the cooling liquid inside the heat transfer structure 111. Of course, the present disclosure is not limited as such, the substrate 211 (leakage detection structure 21, 21') of the present disclosure can surround any location that may be at risk of leakage, and an absorbent layer can also be provided at a place corresponding to the location of the substrate 211.

In conclusion, by providing the leakage detection system 2 and the leakage detection structure 21 of the present disclosure in the liquid cooling device 1, 1', leakage liquid can be effectively detected. The absorbent layer 213 exhibiting capillary action can further guide the cooling liquid leaking from the joints between the leakage detection structure 21 and the pipe 25 or the liquid cooling device 1, 1' to the leakage detection structure 21 to prevent the cooling liquid from leaking out of the joints due to gravity. In addition, the leakage detection system 2 has a warning function that provides warning to a user when the leakage has just occurred. This helps the user in preventing significant loss of assets.

The above embodiments are merely provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. A leakage detection system, comprising:
    a substrate provided between a first element and a second element;
    at least one sensing unit provided on the substrate for generating an electrical signal when coming into contact with a leakage liquid; and
    an absorbent layer provided between the first element and the second element for absorbing the leakage liquid of the first element or the second element and guiding the leakage liquid to the sensing unit.

2. The leakage detection system of claim 1, further comprising at least one connector connecting the first element and the second element and surrounded by the substrate, the sensing unit and the absorbent layer.

3. The leakage detection system of claim 2, wherein the substrate and the sensing unit are positioned between the at least one connector and the absorbent layer.

4. The leakage detection system of claim 3, further comprising an isolation layer provided on an outer side of the absorbent layer for preventing external liquids from penetrating into the absorbent layer.

5. The leakage detection system of claim 4, further comprising a barrier layer provided on an outer side of where the isolation layer joins with the first element for preventing the leakage liquid.

6. The leakage detection system of claim 2, wherein the first element is a pipe, the second element is a liquid cooling device, and the connector connects the pipe and the liquid cooling device.

7. The leakage detection system of claim 1, further comprising:
    a processing module coupled to the substrate and the sensing unit via a signal line for generating a warning signal upon receiving the electrical signal, the warning signal being transmitted to a buzzer on a circuit board via another signal line coupled between the processing module and the circuit board or transmitted to a software interface.

8. The leakage detection system of claim 1, wherein the sensing unit is a capacitive or a resistive humidity sensor.

* * * * *